United States Patent
Stolze et al.

(10) Patent No.: US 11,555,838 B2
(45) Date of Patent: Jan. 17, 2023

(54) METHOD FOR CHECKING QUALITY WHEN RESISTANCE-WELDING WORKPIECES

(71) Applicant: Robert Bosch GmbH, Stuttgart (DE)

(72) Inventors: Josephine Stolze, Eberbach (DE); Juergen Haeufgloeckner, Schneeberg (DE)

(73) Assignee: Robert Bosch GmbH, Stuttgart (DE)

( * ) Notice: Subject to any disclaimer, the term of this patent is extended or adjusted under 35 U.S.C. 154(b) by 387 days.

(21) Appl. No.: 16/589,492

(22) Filed: Oct. 1, 2019

(65) Prior Publication Data
US 2020/0116767 A1 Apr. 16, 2020

(30) Foreign Application Priority Data

Oct. 11, 2018 (DE) ...................... 10 2018 217 364.8

(51) Int. Cl.
| | |
|---|---|
| *G01R 19/257* | (2006.01) |
| *G01R 23/15* | (2006.01) |
| *B23K 11/11* | (2006.01) |
| *B23K 11/36* | (2006.01) |

(52) U.S. Cl.
CPC ........... *G01R 19/257* (2013.01); *G01R 23/15* (2013.01); *B23K 11/115* (2013.01); *B23K 11/36* (2013.01)

(58) Field of Classification Search
CPC ..... B23K 11/115; B23K 11/253; B23K 11/36; B23K 31/125; G01R 19/257; G01R 23/15

USPC ......................................................... 219/110
See application file for complete search history.

(56) References Cited

FOREIGN PATENT DOCUMENTS

| DE | 3811834 | * | 10/1988 |
|---|---|---|---|
| DE | 10144286 | * | 1/2003 |
| DE | 10 2015 111 459 A1 | | 1/2017 |
| JP | H10-202371 A | | 8/1998 |
| JP | 2009-66612 A | | 4/2009 |

* cited by examiner

*Primary Examiner* — Dana Ross
*Assistant Examiner* — Joseph W Iskra
(74) *Attorney, Agent, or Firm* — Maginot, Moore & Beck LLP

(57) ABSTRACT

A method for checking quality when resistance-welding workpiece includes pressing welding electrodes with an electrode force against a weld spot of the workpieces using an electrode drive and energizing the welding electrodes with a welding current for a duration of a welding time in order to liquefy a surface of the workpieces. The method further includes determining, at a first time before a beginning of the liquefaction, a first value of a welding electrode parameter identifying a position of one or both electrodes, and determining, at a second time after the beginning of the liquefaction, a second value of the welding electrode parameter identifying a position of one or both electrodes. The method further includes comparing the first value and the second value and, evaluating a quality of the welding process based on the comparison.

18 Claims, 3 Drawing Sheets

METHOD FOR CHECKING QUALITY WHEN RESISTANCE-WELDING WORKPIECES

This application claims priority under 35 U.S.C. § 119 to patent application no. DE 102018217364.8 filed on Oct. 11, 2018 in Germany, the disclosure of which is incorporated herein by reference in its entirety.

The disclosure relates to a method for checking quality when resistance-welding workpieces, and to a control unit, to a welding device and to a computer program for performing said method.

BACKGROUND

Welding processes, such as for example resistance welding, may be used to connect workpieces to one another in a bonded manner. By way of example, in the course of automated body in white production using robot-controlled welding guns, various workpieces, for example metal sheets, are welded to one another by way of resistance welding.

In the course of the resistance welding, two welding electrodes of a welding gun are first of all pressed against a weld spot of the workpieces by way of an electrode drive in the course of what is known as a force generation phase until a predefined electrode force is reached. The actual welding process then takes place, in the course of which the welding electrodes are energized with a welding current for the duration of a welding time, as a result of which resistance heating of the two workpieces to be welded takes place between the welding electrodes, and the workpieces are heated until reaching a required welding temperature.

SUMMARY

Against this background, a method for checking quality when resistance-welding workpieces, and a control unit, a welding device and a computer program for performing said method having the features of the disclosure are proposed. Advantageous configurations are the subject matter of the disclosure.

Welding electrodes are pressed with an electrode force against a weld spot of the workpieces by way of an electrode drive and, in the course of a welding process, the welding electrodes are energized with a welding current in order to liquefy or to melt a surface of the workpieces. The welding current strength is in particular increased at the beginning of the welding process up to a predefined value in the course of what is known as a current generation phase. At the end of the welding process, the welding current strength is expediently reduced down to the value of zero in the course of what is known as a current reduction phase.

In the context of the present method, a first value of a welding electrode parameter identifying a position of one or both electrodes is determined at a first time. At this first time, the welding electrodes are pressed with the electrode force against the weld spot of the workpieces before a beginning of the liquefaction. At a second time after a beginning of the liquefaction, a second value of the welding electrode parameter is determined, wherein the welding electrodes are pressed with the electrode force against the weld spot of the workpieces at this second time.

The first time is in particular a time before a beginning or during the first phases of the welding process, at which the material surfaces are however not yet liquefied or melted. Either no welding current yet flows at the first time or a welding current does already flow, but is still low enough that liquefaction of the workpiece surfaces does not take place.

The second time is in particular a time during the last phases or after the end of the welding process. The workpiece surfaces may in particular already be solidified again at the second time. Either no welding current flows any more at the second time or a welding current does still flow, but this is too low to allow any further liquefaction. The second time thus lies in particular after an end of the liquefaction, that is to say no further phase transition from solid to liquid takes place, more particularly after the beginning of the solidification, that is to say a phase transition from liquid to solid already takes place, even more particularly after the end of the solidification, that is to say the workpiece surfaces are already solid again.

The first value and the second value are compared with one another and a quality of the welding process is evaluated depending on a comparison result. In the context of the disclosure, it has been recognized that the welding electrode parameter and in particular its first and second value before, respectively after, the beginning of the liquefaction constitute a particularly effective option for being able to evaluate and further quantify the quality of the welding process.

The welding electrode parameter identifying a position of one or both electrodes characterizes a position or location of the welding electrodes. By way of example, the position actual value may be determined in this case relative to the weld spot or the workpieces, or expediently also in relation to a reference point of the welding device, in particular to a rest position of the welding electrodes. The position or the position actual value in particular characterizes the position of the electrode caps in space. Furthermore, in particular only one axis is taken into consideration, expediently an axis in the direction of movement of the electrodes, which may be given by a position actual value of a drive that opens and closes the electrodes.

The first value thus describes the position or location before the beginning of the liquefaction of the workpiece surfaces and thus in particular before or at the beginning of the welding process, expediently relative to the weld spot. The second value describes the position/location after the beginning of the liquefaction of the workpiece surfaces and thus in particular after or at the end of the welding process, likewise in particular relative to the weld spot. Comparing the first and second value makes it possible in particular to conclude as to how the position of the welding electrodes has changed relative to the weld spot and thus furthermore how the workpieces on the weld spot have changed during the welding process. This comparison thus allows useful conclusions about the quality of the weld connection, generated on the weld spot, of the workpieces, and thus about the quality of the welding process.

The position actual value constitutes a particularly advantageous welding electrode parameter for being able to conclude as to properties and conditions of the welding process and in particular for being able to evaluate the quality of the welding process. Since, in the case of weld spatters, liquid metal is removed from the workpieces, this leads to a situation whereby the welding electrodes are moved further toward the workpieces and the position actual value in particular increases.

Values of the welding electrode parameter may in particular also continue to be determined between the first and the second time, that is to say in particular during the welding process, and used to assess the quality. The welding process may thus in particular be monitored continuously by way of the welding electrode parameter.

According to one advantageous embodiment, the first time is a time at which the welding electrodes are pressed with the electrode force against the weld spot of the workpieces, but are not yet energized with the welding current. In particular, the first time in this case takes place before a beginning of the welding process. By way of example, the first time may in this case lie in what is known as the pre-holding phase, which lies between the force generation phase and the beginning of the welding process in the case of resistance welding.

The second time is advantageously a time at which the welding electrodes are no longer energized with the welding current but are still pressed with the electrode force against the weld spot of the workpieces. The second time thus takes place in particular after an end of the welding process. In this case, the second time may lie for example in what is known as the post-holding phase, in particular after the end of the welding process before the welding electrodes are moved away from the weld spot.

As an alternative, it is also conceivable, according to one advantageous embodiment, for a welding current to flow at the first and/or second time, which welding current in particular does not cause any liquefaction of the surfaces.

The first time is preferably a time during a current generation phase, that is to say while the welding current strength is increasing after the beginning of the energization of the welding electrodes. As an alternative, the first time is preferably a time during what is known as a preconditioning phase, during which in particular a welding current is already flowing through the welding electrodes, the welding current strength of which welding current is however still too low for any liquefaction of the workpiece surfaces to yet take place. As an alternative, the first time is preferably a time within the first 10% of the duration of the welding time.

The second time is preferably a time during a current reduction phase, that is to say while the welding current strength is reduced to the value of zero. As an alternative, the second time is preferably a time during what is known as a post-heating phase, during which a welding current still flows through the welding electrodes, wherein the welding current strength is however already too low to further liquefy the workpiece surfaces. As an alternative, the second time is a time within the last 10% of the duration of the welding time.

According to one particularly preferred embodiment, effects of weld spatters on the quality of the welding process are quantified from the first value and the second value. Weld spatters are understood to be drops of molten metal that escape due to the extreme intensity of heat and force that are applied on or around the weld spot. Such weld spatters may negatively influence the weld quality, since the material lost in this way is no longer available on the weld spot.

Since a weld spatter moves liquid metal away from the workpieces, the welding electrodes are moved further onto the workpiece or toward one another when a weld spatter occurs, and the current location or position of the welding electrodes changes. By way of the welding electrode parameter, which in particular characterizes the location or position of the welding electrodes relative to the weld spot, it is possible to evaluate and in particular quantify the effects of weld spatters.

The more material is lost on the weld spot through weld spatters, the more negative the effects on the quality of the welding process, the further the welding electrodes are moved toward one another in the course of the welding process on the weld spot, the greater the change in the welding electrode parameter and the greater the difference between the first and second value of the welding electrode parameter.

Effects of weld spatters on the quality of the weld spot or of the welding process are generally not able to be easily evaluated in a conventional manner, since they depend on a multiplicity of different factors, by way of example on the thicknesses of the individual workpieces or on the plane of the connection in which the spatter occurs, for instance on the surface of one of the workpieces or between the workpieces. By way of the welding electrode parameter, it is now made possible to be able to evaluate and quantify effects of weld spatters on the welding process quality.

Advantageously, a difference between the first value and the second value is calculated, and this difference is compared with at least one threshold value. This difference expediently quantifies the change in the position of the welding electrodes relative to the weld spot during the welding process, and furthermore in particular the change in the workpieces at the weld spot. This difference thus constitutes a particularly advantageous quantitative variable for being able to evaluate the quality of the welding process.

An indentation depth and/or a remaining wall thickness of the weld spot are preferably evaluated as quality of the welding process. An indentation depth is understood in particular to mean how deeply the welding electrodes penetrate into the workpieces in the course of the welding process on the weld spot. A remaining wall thickness is understood to mean in particular the thickness of the workpieces connected at the weld spot. In particular, both the indentation depth and the remaining wall thickness characterize the change in the workpieces at the weld spot, and allow a conclusion about the quality of the welding process. It is in particular possible to draw a conclusion about the indentation depth from the welding electrode parameter that characterizes the position of the welding electrodes. It is expediently possible to draw a conclusion about the remaining wall thickness from the indentation depth, and from this in turn to draw a conclusion in particular about the quality of the welding process.

The indentation depth and/or a remaining wall thickness of the weld spot are preferably quantified from the first value and the second value. The welding electrode parameter characterizing the position of the welding electrodes, and in particular its first value immediately before and its second value immediately after the welding process, thus constitute a particularly advantageous option for determining such quantitative variables for evaluating the welding process quality.

The welding electrode parameter is advantageously a drive parameter of the electrode drive. Drive parameters are understood in this connection in particular to be variables or parameters that are determined in the course of regulation or control of the electrode drive so as to move the welding electrodes in a predefined manner and to press them against the workpieces. The drive parameter in particular characterizes the current location or position or movement of the welding electrodes. It is therefore expediently possible to draw conclusions about the current position of the welding electrodes from the values of the drive parameter, and on the basis of this in turn about the welding process or the properties of the workpieces. The drive parameter is therefore particularly advantageous for evaluating the quality of the welding process.

By way of example, the drive parameter may be a control and/or regulation variable of the electrode drive, in particular an actual value and/or setpoint value of the electrode drive, which are determined in the course of the regulation of the electrode drive so as to regulate the electrode force to a predefined value. The electrode drive may be in particular an electric and/or mechanical and/or pneumatic electrode drive. The drive parameter may therefore be for example a corresponding electric and/or mechanical and/or pneumatic variable.

A possibility is thus preferably provided of further using drive parameters, which are determined for the regulation or control of the electrode drive, to evaluate the quality of the welding process. Conventionally, in the case of resistance welding, the electrode drive is generally regulated mostly by way of a corresponding drive controller, and the welding process is regulated independently thereof, usually by way of a separate independent welding controller. It is usually not possible to access parameters of the drive regulation in the course of the welding process regulation. In the context of the present method, however, it has proven to be particularly advantageous if drive parameters of the regulation of the electrode drive are incorporated in order to evaluate the quality of the welding process. The present method thus advantageously provides a possibility of linking the regulations of the welding process and of the electrode drive to one another and incorporating the drive parameters, which are usually determined in any case in order to regulate the electrode drive, into the regulation of the welding process in order to evaluate the welding process quality.

Advantageously, a sheet-metal thickness combination of the workpieces is further taken into consideration in the course of the comparison. A sheet-metal thickness combination is understood in this connection to mean a combination of workpieces that are to be welded to one another and that have different workpiece thicknesses, wherein a workpiece thickness is in turn understood to mean in particular a thickness of the respective workpiece in a direction perpendicular to the welding direction or in a direction parallel to a direction along which force is exerted on the workpieces by the welding process.

The welding region required for a specific sheet-metal thickness combination is generally very narrow, that is to say the region at which a good quality of the welding process needs to be achieved. This results in the risk, in the case of resistance welding, of a specific sheet-metal thickness combination moving out of the corresponding welding region, as a result of which the number of weld spatters increases and the quality of the weld connection decreases. Therefore, in the context of the method, the sheet-metal thickness combination of the workpieces to be welded is now advantageously also taken into consideration in order to evaluate the quality of the welding process. In the course of the quality evaluation, the remaining wall thickness, remaining after the welding process, of the weld spot may, for example, thus be compared with the thicknesses of the workpieces, and it may thus be evaluated whether the weld spot has actually formed but has not reached a required strength.

The present method is therefore particularly advantageous for processes in which a multiplicity of weld spots having complex, differing sheet-metal thickness combinations need to be welded to one another. By way of example, the method is particularly advantageously suitable for body in white production, in particular for automated welding processes in body in white production, preferably in the course of motor vehicle production. In particular, metal sheets are in this case welded to one another in order to manufacture the body of a motor vehicle. In the course of the process of manufacturing a single body, up to several thousand weld spots having several hundred different sheet-metal thickness combinations may be machined automatically, for example around 5000 weld spots having around 700 different sheet-metal thickness combinations for a mid-range vehicle. The quality of the individual weld spots is able to be evaluated precisely by way of the method.

At least one welding parameter is furthermore preferably taken into consideration in the course of the comparison. Welding parameters are understood here in this connection expediently to be variables or parameters that relate to the welding process itself and thus in particular electrical operation of the welding electrodes. In particular, the welding current and/or a welding voltage and/or the current time or welding time (that is to say the time during which the welding current flows) may be taken into consideration as welding parameters. It is likewise conceivable to take into consideration a response of the welding process regulation to the at least one welding parameter.

The workpieces are preferably made from aluminum and/or steel. The workpieces may in this case for example be thin metal sheets having a thickness of in particular up to 1 mm. Resistance-welding of such workpieces represent particularly difficult cases of application for precise welding process regulation. By virtue of the present method, the quality of the welding process in such difficult cases of application is able to be evaluated precisely.

A control unit (computing unit) according to the disclosure, for example a welding controller of a welding device, is configured, in particular in terms of programming, so as to perform a method according to the disclosure. The control unit or welding controller may be designed for example as a PLC (programmable logic controller), as an NC (numerical controller) or CNC (computerized numerical controller).

A welding device according to the disclosure for resistance welding in particular has a welding gun having welding electrodes and an electrode drive for moving the welding electrodes. The welding device furthermore comprises a preferred configuration of a control unit according to the disclosure.

It is also advantageous to implement a method according to the disclosure in the form of a computer program containing program code for performing all of the method steps, since this in particular brings about low costs, in particular when an executing controller is also used for other tasks and is therefore present in any case. Suitable data carriers for providing the computer program are in particular magnetic, optical and electrical memories, such as for example hard disks, flash memories, EEPROMs, DVDs and the like. It is also possible to download a program via computer networks (Intranet, Internet, etc.).

Further advantages and configurations of the disclosure become apparent from the description and the attached drawing.

It is understood that the features mentioned above and the features yet to be mentioned below are able to be used not only in the respectively specified combination but also in other combinations or on their own without departing from the scope of the disclosure.

The disclosure is illustrated schematically on the basis of exemplary embodiments in the drawing and is described in detail below with reference to the drawing.

DETAILED DESCRIPTION

Figure 1:
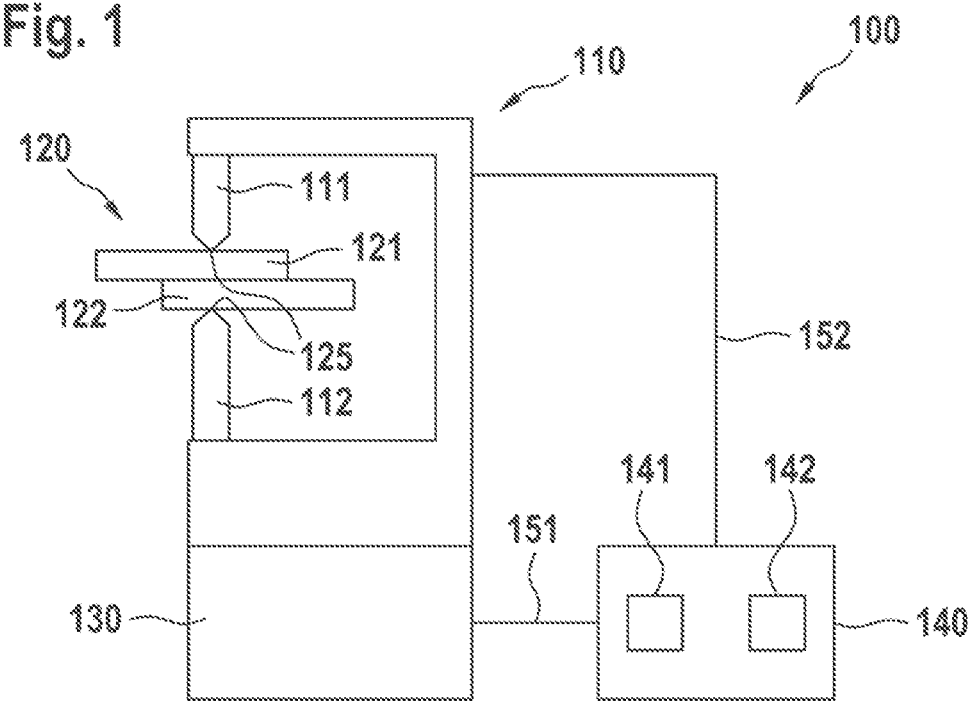
FIG. 1 schematically shows one preferred configuration of a welding device according to the disclosure that is configured so as to perform one preferred embodiment of a method according to the disclosure.

FIG. 1 schematically illustrates a welding device for resistance welding, this device being denoted 100.

The welding device 100 is able to connect workpieces 120 to one another in a bonded manner through resistance welding. The workpieces 120 are in particular welded to one another in the course of body in white production, wherein a body of a motor vehicle is in particular manufactured. Two metal sheets 121 and 122 made from aluminum are welded to one another as workpieces here, by way of example.

The welding device 100 has a welding gun 110 having two welding electrodes 111 and 112. An electrode drive 130 is provided in order to move the welding electrodes 111, 112. In FIG. 1, the welding gun 110 is illustrated for example in the form of a servo-electric welding gun with an electrode drive 130 designed as a servo-motor. It is likewise conceivable for the electrode drive 130 to be able to be designed for example in the form of an electric motor, hydraulic motor or pneumatic motor.

In the course of the resistance welding, the welding electrodes 111 and 112 are pressed with an electrode force on a weld spot 125 against the metal sheets 121 and 122 by way of the electrode drive 130 during what is known as a force generation phase. The welding electrodes 111 and 112 are then energized with a welding current during the actual welding process for the duration of a welding time, as a result of which resistance heating of the metal sheets 121 and 122 takes place at the weld spot 125 and the surface of the workpieces 121, 122 is liquefied.

The welding device 100 furthermore has a control unit (welding controller) 140 that may be designed for example as a PLC (programmable logic controller). The control unit 140 is configured so as to regulate the electrode drive 130, indicated by reference sign 151, and also the welding process, indicated by reference sign 152. For this purpose, corresponding drive regulation 141 and corresponding welding process regulation 142 are performed in the control unit 130, each of which may be implemented as corresponding control programs or else as a joint control program.

Figure 2:
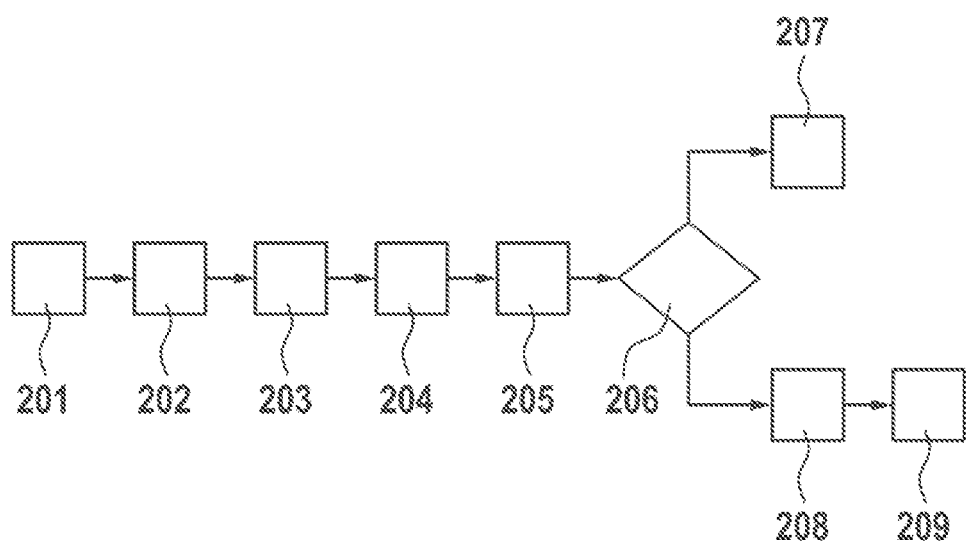
FIG. 2 schematically shows one preferred embodiment of a method according to the disclosure in the form of a block diagram.

The control unit 140 is furthermore configured so as to evaluate a quality of the welding process or of the generated weld spot 125. For this purpose the control unit 140 is configured, in particular in terms of programming, so as to perform a preferred embodiment of a method according to the disclosure, this being illustrated schematically in FIG. 2 as a block diagram and being explained below with reference to FIGS. 1 and 2.

Step 201 denotes the force generation phase, in the course of which the welding electrodes 111 and 112 are pressed against the metal sheets 121 and 122 on the weld spot 125 by way of the electrode drive 130 until the predefined electrode force is reached.

Step 202 denotes what is known as a pre-holding phase, during which the welding electrodes 111, 112 are pressed with the electrode force against the weld spot 125 of the workpieces 121, 122 before the beginning of the welding process, but are not yet energized with the welding current. During this pre-holding phase, in the present example, a first value of a position actual value of the electrode drive 130 that characterizes the current position of the welding electrodes 111, 112 is determined as welding electrode parameter at a first time before a beginning of the liquefaction of the surfaces of the workpieces 121, 122.

In step 203, the welding process then takes place, in the course of which the welding electrodes 111, 112 are energized with the welding current for the duration of the welding time.

It is also conceivable to determine the first value of the position actual value after the beginning of the welding process during the first phases, as long as no liquefaction of the workpiece surfaces has yet taken place. By way of example, the first value may then be determined at a first time that may lie within up to 10% of the welding duration, for example during what is known as a preconditioning phase.

After the end of the welding time and after the energization of the welding electrodes 111, 112 has been ended, in step 204, what is known as the post-holding phase takes place, during which the welding electrodes 111, 112 are still pressed with the electrode force against the weld spot 125 of the workpieces 121, 122, but are no longer energized with the welding current. During this post-holding phase, in the present example, a second value of the welding electrode parameter, that is to say of the position actual value of the electrode drive 130, is determined at a second time after the beginning of the liquefaction of the surfaces of the workpieces 121, 122. The second time in particular lies here already after the end of the solidification.

As an alternative, the second value of the position actual value may also be determined during the last phases before the end of the welding process, when a small welding current is still flowing. By way of example, the second value may be determined at a second time that may lie after 90% of the complete welding duration, for instance during what is known as a post-heating phase.

The first value and the second value of the position actual value are then compared with one another and a quality of the welding process or of the generated weld spot 125 is evaluated depending on a comparison result. For this purpose, a difference between the first value and the second value is calculated in step 205. This difference characterizes in particular how the position actual value has changed during the welding process. If weld spatters occur during the welding process, liquid metal on the weld spot 125 is removed from the workpieces 121, 122, the welding electrodes 111, 112 move further toward one another and the position actual value increases. This difference thus constitutes a particularly advantageous variable for being able to evaluate and quantify the effects of weld spatters on the quality of the welding process.

In step 206, the difference is then compared with a threshold value. The threshold value may be selected for example depending on a sheet-metal thickness combination of the workpieces 121, 122 to be welded. If the difference does not reach the threshold value, this indicates that the position of the welding electrodes 111, 112 has not changed by more than a permissible value during the welding process, and that no weld spatters have therefore occurred or that at least no quality impairment has occurred in the event of occurrence of a weld spatter. In step 207, it is evaluated in this case that a high quality of the welding process or of the weld spot 125 has been achieved.

If on the other hand the difference reaches or exceeds the threshold value, the position of the welding electrodes 111, 112 has changed by more than the permissible value during the welding process, since a weld spatter has occurred. In step 208, it is evaluated in this case that the remaining wall thickness of the weld spot 125 is not high enough to guarantee a desired strength and that sufficient quality of the welding process or of the weld spot 125 has not been achieved. In this case, a corresponding measure may be performed in step 209, by way of example a fault notification may be output that the weld spot 125 has been formed, but the required strength has not been achieved.

Figure 3:
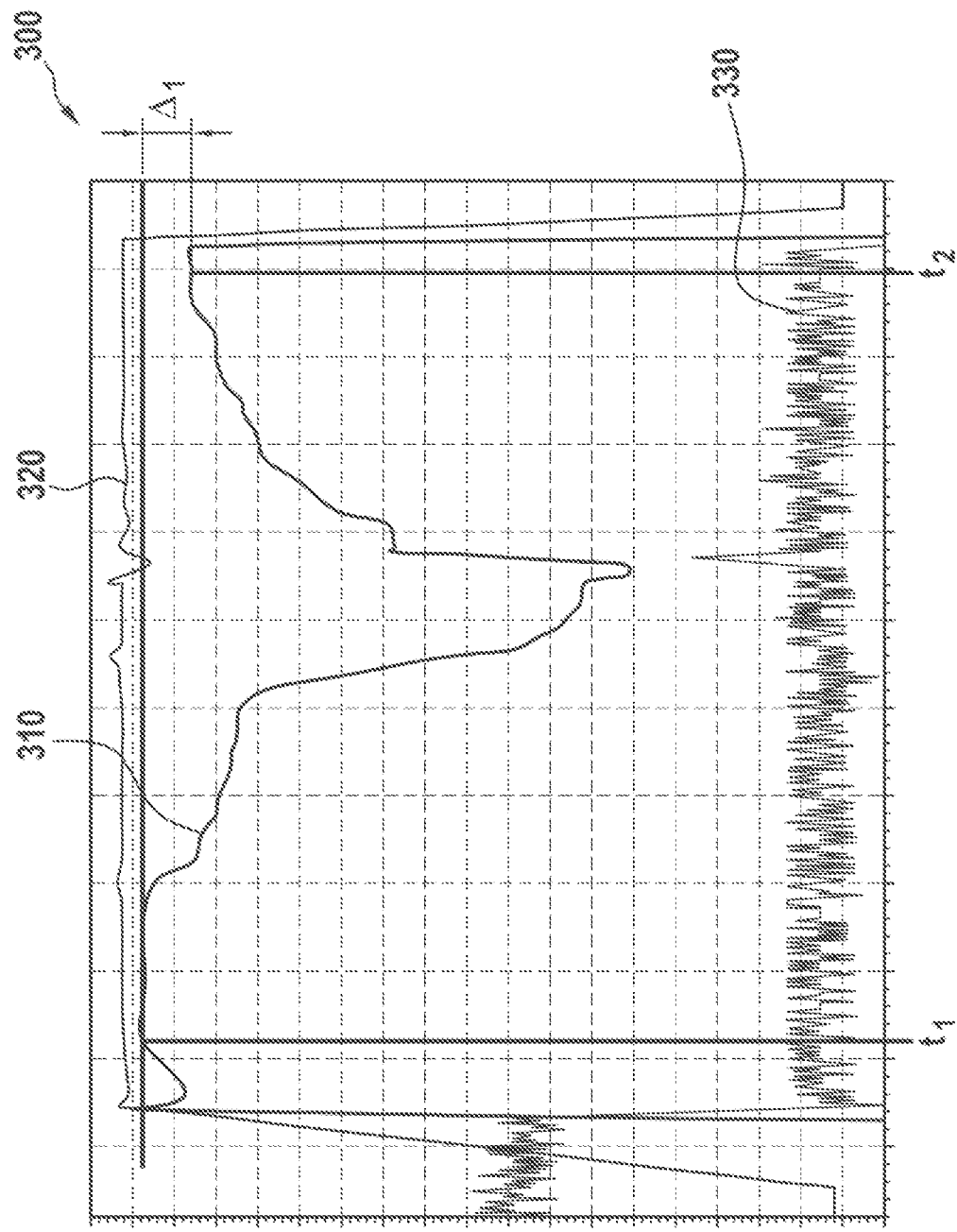
FIG. 3 schematically shows time sequences of welding electrode parameters that are able to be determined in the course of one preferred embodiment of a method according to the disclosure.

FIG. 3 schematically shows a graph 300 of welding electrode parameters plotted against time, which parameters may be determined in the course of one preferred embodiment of the method according to the disclosure.

Curve 310 shows the temporal profile of the position actual value. FIG. 3 furthermore illustrates the temporal profile 320 of the electrode force and the temporal profile 330 of the rotational speed actual value of the electrode drive 130. The curves 310, 320, 330 illustrated in FIG. 3 in particular characterize a high-quality welding process in which no weld spatter has occurred.

FIG. 3 furthermore illustrates the difference Δ1 between the first value of the position actual value, determined at the first time t1, and the second value of the position actual value, determined at the second time t2. The difference Δ1 in the example that is shown has a positive value, which indicates that the electrodes have moved apart from one another and no weld spatter has thus occurred.

Figure 4:
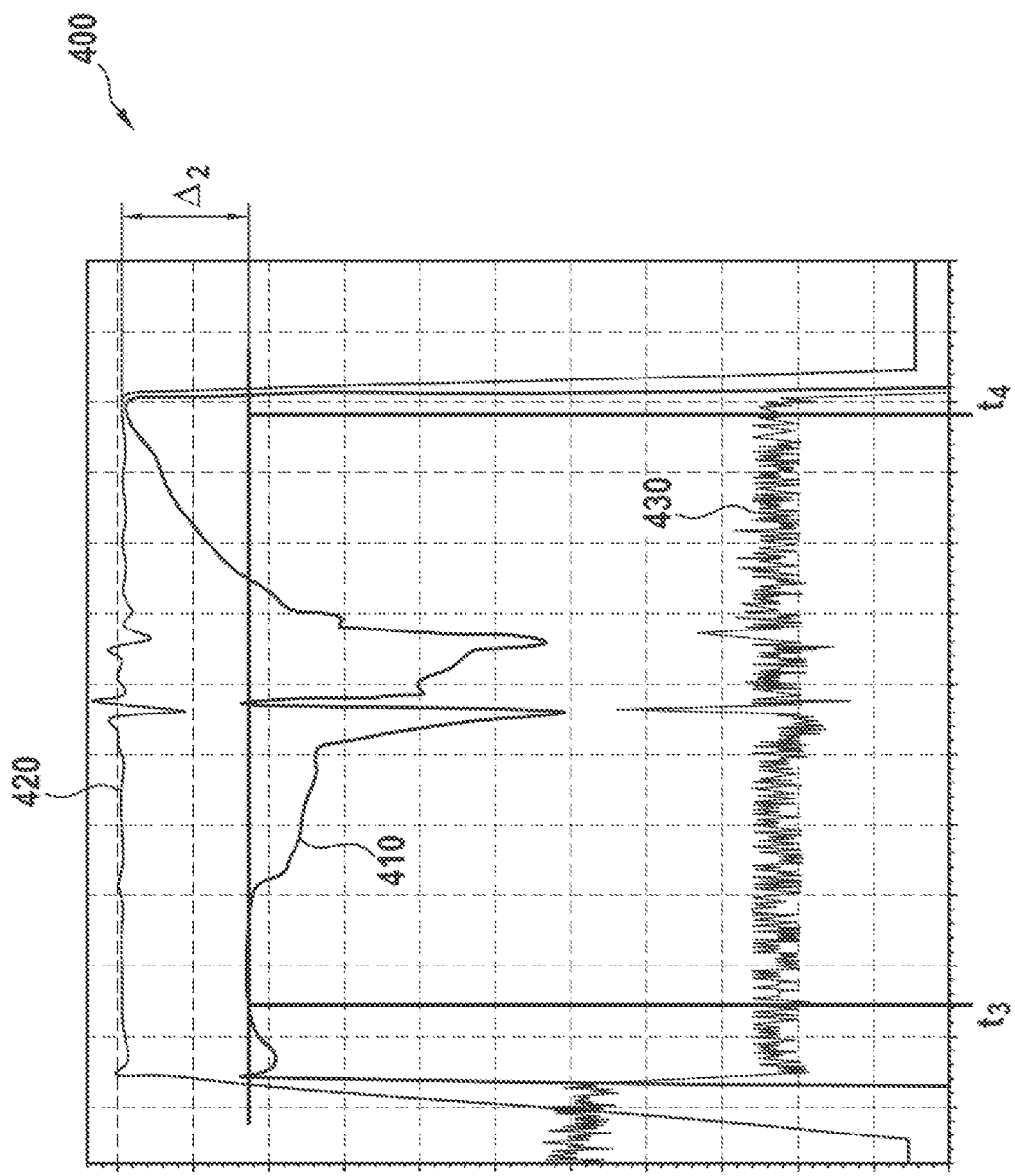
FIG. 4 schematically shows time sequences of welding electrode parameters that are able to be determined in the course of one preferred embodiment of a method according to the disclosure.

In the same way as FIG. 3, FIG. 4 also schematically shows a graph 400 of welding electrode parameters plotted against time, which parameters may be determined in the course of one preferred embodiment of the method according to the disclosure. FIG. 4 also illustrates the temporal profiles of the position actual value 410, of the electrode force 420 and of the rotational speed actual value 430 of the electrode drive 130. FIG. 4 however shows the case of an insufficient-quality welding process in which a weld spatter has occurred.

FIG. 4 furthermore shows, in the same way as FIG. 3, the difference Δ2 between the first value of the position actual value, determined at the first time t3, and the second value of the position actual value, determined at the second time t4. The difference Δ1 has a negative value in this example, which indicates that the electrodes have moved toward one another and thus indicates a weld spatter.

What is claimed is:

1. A method for checking quality when resistance-welding workpieces, the method comprising:
pressing welding electrodes with an electrode force against a weld spot of the workpieces using an electrode drive;
energizing the pressed welding electrodes with a welding current for a duration of a welding time in order to liquefy a surface of the workpieces;
determining, at a first time before a beginning of the liquefaction, a first value of a welding electrode parameter identifying a position of one or both of the welding electrodes, wherein the welding electrodes are pressed with the electrode force against the weld spot of the workpieces at the first time;
determining, at a second time after the beginning of the liquefaction, a second value of the welding electrode parameter identifying a position of one or both of the welding electrodes, wherein the welding electrodes are pressed with the electrode force against the weld spot of the workpieces at the second time;
comparing the first value and the second value;
evaluating a quality of a welding process based on the comparison; and
quantifying effects of weld spatters on the quality of the welding process from the first value and the second value using a control unit configured to receive the first value and the second value,
wherein the quantified effects include a determination of a quantity of the workpieces that is lost on the weld spot through weld spatters.

2. The method according to claim 1, wherein the comparing the first value and the second value includes taking into consideration a sheet-metal thickness combination of the workpieces and/or at least one welding parameter.

3. The method according to claim 1, wherein the workpieces are produced from aluminum and/or steel.

4. The method according to claim 1, wherein the first time is when the welding electrodes are pressed with the electrode force against the weld spot of the workpieces but the welding electrodes are not yet energized with the welding current.

5. The method according to claim 1, wherein the first time includes a current generation phase, a preconditioning phase, and/or a first 10% of the duration of the welding time.

6. A method for checking quality when resistance-welding workpieces, the method comprising:
pressing welding electrodes with an electrode force against a weld spot of the workpieces using an electrode drive;
energizing the pressed welding electrodes with a welding current for a duration of a welding time in order to liquefy a surface of the workpieces;
determining, at a first time before a beginning of the liquefaction, a first value of a welding electrode parameter identifying a position of one or both of the welding electrodes, wherein the welding electrodes are pressed with the electrode force against the weld spot of the workpieces at the first time;
determining, at a second time after the beginning of the liquefaction, a second value of the welding electrode parameter identifying a position of one or both of the welding electrodes, wherein the welding electrodes are pressed with the electrode force against the weld spot of the workpieces at the second time;
comparing the first value and the second value; and
evaluating a quality of a welding process based on the comparison,
wherein the second time is when the welding electrodes are not energized with the welding current but are still pressed with the electrode force against the weld spot of the workpieces.

7. The method according to claim 1, wherein the second time includes a current reduction phase, a post-heating phase, and/or a last 10% of the duration of the welding time.

8. The method according to claim 1, wherein:
a control unit is configured to perform the method, and
a welding device includes the control unit.

9. The method according to claim 1, wherein a computer program is configured to prompt a control unit to perform the method when the computer program is executed on the control unit.

10. The method according to claim 9, wherein the computer program is stored on a non-transitory machine-readable storage medium.

11. The method according to claim 1, further comprising:
calculating a difference between the first value and the second value; and
comparing the calculated difference with at least one threshold value.

12. The method according to claim 1, further comprising:
quantifying an indentation depth and/or a remaining wall thickness of the weld spot based on the first value and the second value using the control unit; and
evaluating the quantified indentation depth and/or the quantified remaining wall thickness when evaluating the quality of the welding process using the control unit,
wherein the indentation depth is how deeply the welding electrodes penetrate into the workpieces during the welding time.

13. The method according to claim 1, wherein the welding electrode parameter includes a drive parameter of the electrode drive and/or a position actual value of the welding electrodes.

14. The method according to claim 6, further comprising:
calculating a difference between the first value and the second value; and
comparing the calculated difference with at least one threshold value.

15. The method according to claim 6, further comprising:
quantifying an indentation depth and/or a remaining wall thickness of the weld spot based on the first value and the second value using a control unit configured to receive the first value and the second value; and
evaluating the quantified indentation depth and/or the quantified remaining wall thickness when evaluating the quality of the welding process using the control unit.

16. The method according to claim 6, wherein the welding electrode parameter includes a drive parameter of the electrode drive and/or a position actual value of the welding electrodes.

17. The method according to claim 6, wherein the first time includes a current generation phase, a preconditioning phase, and/or a first 10% of the duration of the welding time.

18. The method according to claim 6, wherein the second time includes a current reduction phase, a post-heating phase, and/or a last 10% of the duration of the welding time.

* * * * *